(12) United States Patent
Brown

(10) Patent No.: US 7,276,418 B2
(45) Date of Patent: Oct. 2, 2007

(54) MEMORY CELL AND METHOD FOR FORMING THE SAME

(75) Inventor: Kris K. Brown, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 11/271,127

(22) Filed: Nov. 10, 2005

(65) Prior Publication Data

US 2006/0063330 A1 Mar. 23, 2006

Related U.S. Application Data

(60) Division of application No. 10/964,872, filed on Oct. 13, 2004, now Pat. No. 7,045,844, which is a continuation-in-part of application No. 10/855,705, filed on May 26, 2004, now Pat. No. 6,921,935, which is a continuation of application No. 10/643,269, filed on Aug. 18, 2003, now Pat. No. 6,797,573, which is a division of application No. 10/177,228, filed on Jun. 21, 2002, now Pat. No. 6,756,625.

(51) Int. Cl.
*H01L 21/336* (2006.01)
(52) U.S. Cl. .................. 438/300; 438/407; 257/300
(58) Field of Classification Search ............... 438/300, 438/303, 329, 341, 363, 366, 413; 257/300, 257/327, 330, 343, 407, 412
See application file for complete search history.

(56) References Cited

U.S. PATENT DOCUMENTS

| | | | |
|---|---|---|---|
| 4,881,105 A | 11/1989 | Davari et al. | 357/23.4 |
| 5,158,901 A | 10/1992 | Kosa et al. | 437/40 |
| 5,497,017 A | 3/1996 | Gonzales | 257/306 |
| 5,753,555 A | 5/1998 | Hada | 438/300 |
| 5,945,707 A | 8/1999 | Bronner et al. | 257/330 |
| 5,970,352 A | 10/1999 | Shiozawa et al. | 438/300 |
| 6,097,065 A | 8/2000 | Forbes et al. | 257/350 |
| 6,100,123 A | 8/2000 | Bracchitta et al. | 438/199 |
| 6,317,357 B1 * | 11/2001 | Forbes | 365/149 |
| 6,388,282 B1 | 5/2002 | Hieda | 257/300 |
| 6,395,597 B2 * | 5/2002 | Noble | 438/242 |
| 6,477,080 B2 | 11/2002 | Noble | 365/154 |
| 6,492,662 B2 | 12/2002 | Hsu et al. | 257/124 |
| 6,504,201 B1 | 1/2003 | Noble et al. | 257/302 |
| 6,511,884 B1 | 1/2003 | Quek et al. | 438/268 |
| 6,518,112 B2 | 2/2003 | Armacost et al. | 438/212 |
| 6,570,200 B1 | 5/2003 | Yoon | 257/288 |
| 6,602,748 B2 | 8/2003 | Watatani | 438/239 |
| 6,756,625 B2 | 6/2004 | Brown | 257/300 |
| 6,797,573 B2 | 9/2004 | Brown | 438/300 |
| 6,921,935 B2 | 7/2005 | Brown | 257/300 |

\* cited by examiner

*Primary Examiner*—Phuc T. Dang
(74) *Attorney, Agent, or Firm*—Dorsey & Whitney LLP

(57) ABSTRACT

A semiconductor memory cell structure having $4F^2$ dimensions and method for forming the same. The memory cell is formed on a surface of a substrate and includes an active region formed in the substrate, a semiconductor post formed on the surface of the substrate over the active region and a capacitor is formed on the semiconductor post. A vertical access transistor having a gate structure formed on the semiconductor post is configured to electrically couple the respective memory cell capacitor to the active region when accessed.

25 Claims, 13 Drawing Sheets

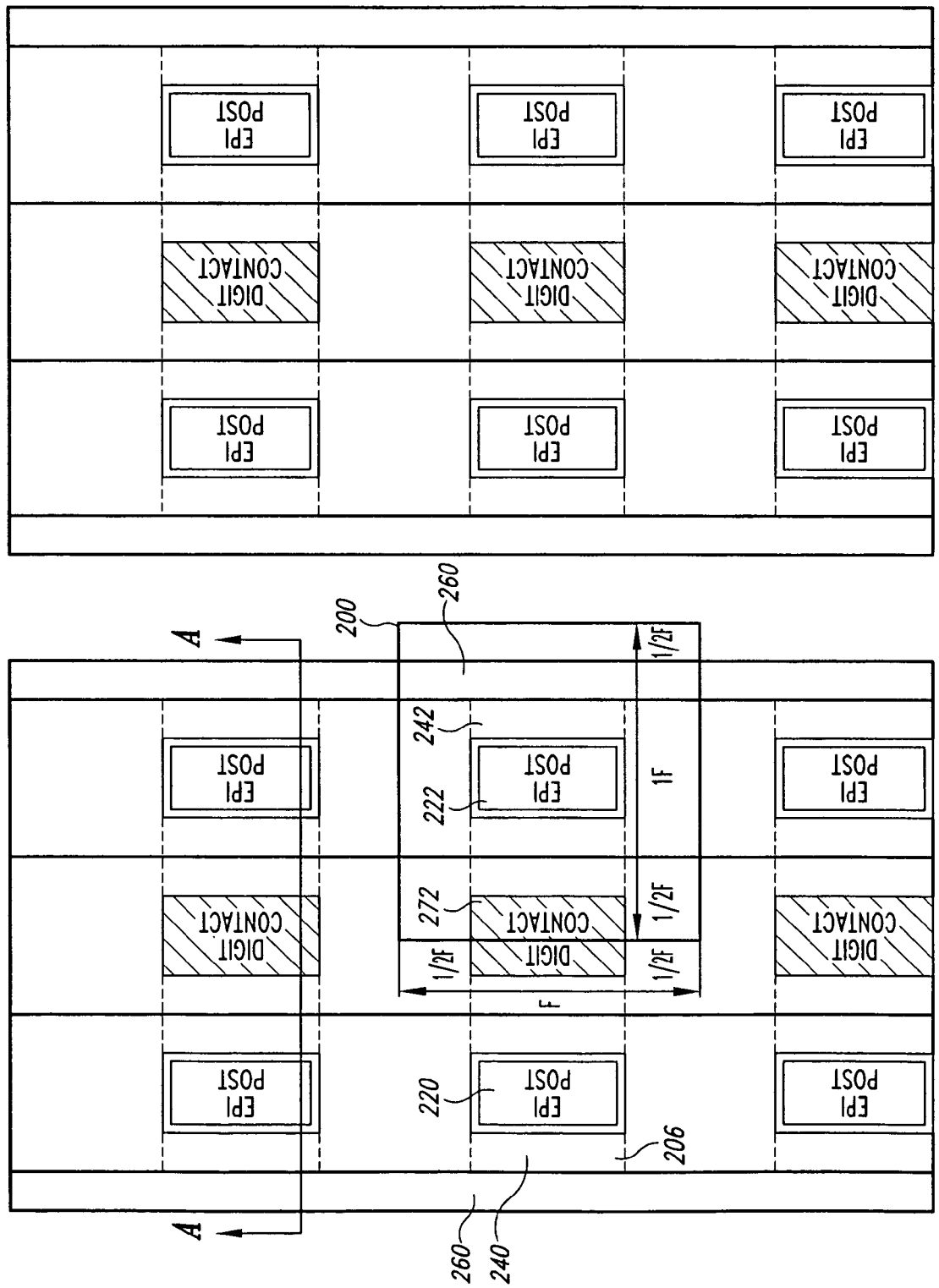

MEMORY CELL AND METHOD FOR FORMING THE SAME

CROSS-REFERENCE TO RELATED APPLICATIONS

This application is a divisional of U.S. patent application Ser. No. 10/964,872, filed Oct. 13, 2004 now U.S. Pat. No. 7,045,844, which is a continuation-in-part of U.S. patent application Ser. No. 10/855,705, filed May 26, 2004, issued Jul. 26, 2005 as U.S. Pat. No. 6,921,935 B2, which is a continuation of U.S. patent application Ser. No. 10/643,269, filed Aug. 18, 2003, issued Sep. 28, 2004 as U.S. Pat. No. 6,797,573 B2, which is a divisional of U.S. patent application Ser. No. 10/177,228, filed Jun. 21, 2002, issued on Jun. 29, 2004 as U.S. Pat. No. 6,756,625.

TECHNICAL FIELD

The present invention relates in general to memory circuits, and more particularly, to dynamic random access memory cells and a method for forming the same.

BACKGROUND OF THE INVENTION

Random access memory ("RAM") cell densities have increased dramatically with each generation of new designs and have served as one of the principal technology drivers for ultra large scale integration ("ULSI") in integrated circuit ("IC") manufacturing. However, in order to accommodate continuing consumer demand for integrated circuits that perform the same or additional functions and yet have a reduced size as compared with available circuits, circuit designers continually search for ways to reduce the size of the memory arrays within these circuits without sacrificing array performance.

With respect to memory ICs, the area required for each memory cell in a memory array partially determines the capacity of a memory IC. This area is a function of the number of elements in each memory cell and the size of each of the elements. For example, FIG. 1 illustrates an array 100 of memory cells 110 for a conventional dynamic random access memory (DRAM) device. Memory cells 110 such as these are typically formed in adjacent pairs, where each pair is formed in a common active region 120 and share a common source/drain region that is connected to a respective digit line via a digit line contact 124. The area of the memory cells 110 are said to be $8F^2$, where F represents a minimum feature size for photolithographically-defined features. For conventional $8F^2$ memory cells, the dimension of the cell area is 2F×4F. The dimensions of a conventional $8F^2$ memory cell are measured along a first axis from the center of a shared digit line contact 124 (½F), across a word line 128 that represents an access transistor (1F), a storage capacitor 132 (1F), an adjacent word line 136 (1F), and half of an isolation region 140 (½F) separating the active region 120 of an adjacent pair of memory cells (i.e., resulting in a total of 4F). The dimensions along a second perpendicular axis are half of an isolation region 150 on one side of the active region 120 (½F), the digit line contact 124 (1F), and half of another isolation region 154 on the other side of the active region 120 (½F) (i.e., resulting in a total of 2F).

In some state-of-the-art memory devices, the memory cells for megabit DRAM have cell areas approaching $6F^2$. Although this is approximately a 25% improvement in memory cell area relative to conventional $8F^2$ memory cells, as previously described, a further reduction in memory cell size is still desirable. Therefore, there is a need for a compact memory cell structure and method for forming the same.

SUMMARY OF THE INVENTION

The present invention is directed to a semiconductor memory cell structure having $4F^2$ dimensions. In one aspect of the invention, a plurality of memory cells include an active region formed in the substrate and a plurality of posts formed on the surface of the substrate over the active region. The plurality of posts are formed from a semiconductor material and spaced apart from one another by respective regions. A plurality of contacts are also formed over and electrically coupled to the active region with each contact having at least a portion formed adjacent a respective one of the regions for a pair of posts. Memory cell capacitors are formed on a respective one of the plurality of posts, and a plurality of gate structures are formed adjacent a respective one of the plurality of posts. The gate structures provide a respective vertical transistor configured to electrically couple the respective memory cell capacitor to the active region.

In another aspect of the invention, the memory cell structure includes an active region formed in the substrate, a semiconductor post formed on the active region, and first and second contacts formed on the active region. The first and second contacts are laterally disposed on opposite sides of the semiconductor post along the surface of the substrate. A memory cell capacitor is formed on the semiconductor post and further includes a vertical access transistor having a gate formed adjacent the semiconductor post. The vertical access transistor is configured to electrically couple the capacitor to the first and second contacts in response to being activated.

BRIEF DESCRIPTION OF THE DRAWINGS

FIG. 2A is a simplified top plan view of memory cells according to an embodiment of the present invention.

As is conventional in the field of integrated circuit representation, the lateral sizes and thicknesses of the various layers are not drawn to scale, and portions of the various layers may have been arbitrarily enlarged or reduced to improve drawing legibility.

DETAILED DESCRIPTION OF PREFERRED EMBODIMENTS

Figure 1:
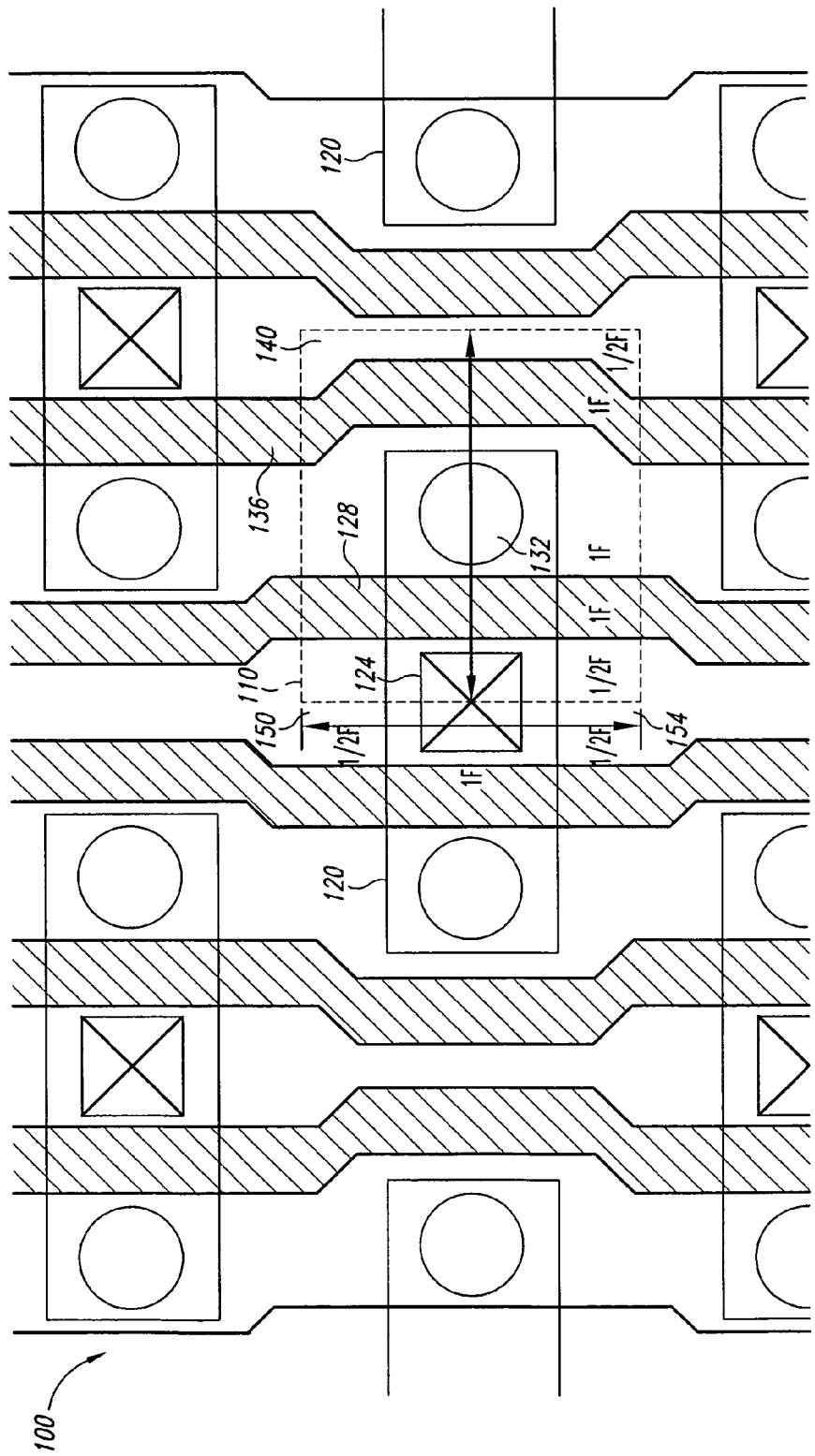
FIG. 1 is a simplified top plan view of conventional memory cells.
Figure 2B:
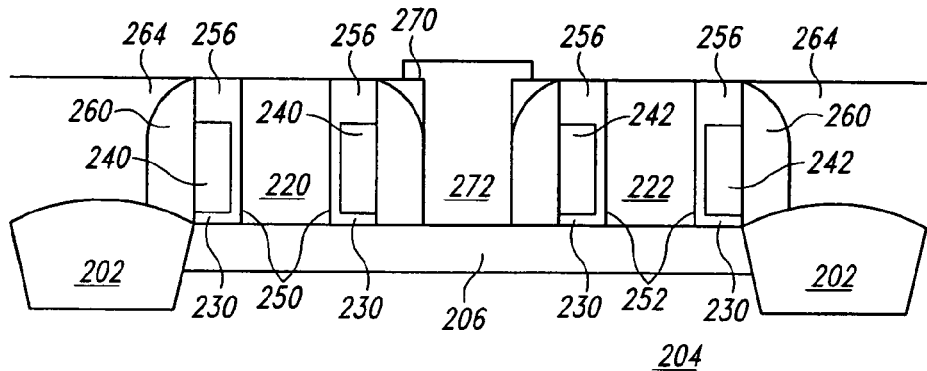
FIG. 2B is a simplified cross-sectional view of a pair of memory cells according to the embodiment shown in FIG. 2A.

FIG. 2A is a top plan view of an array of memory cells 200 according to an embodiment of the present invention. As shown in FIG. 2A, capacitors have not been illustrated in order to avoid unnecessarily obscuring the other structures of the memory cell 200. The dimensions of the cell 200 are $4F^2$. That is, the cell 200 measures 2F along a first axis, starting with half of a digit line contact (½F), and extending over an epitaxial post on which a capacitor is formed (1F) and half of an isolation region (½F). Along a second perpendicular axis, the cell 200 measures 2F, starting with half of an isolation region (½F), and extending over the digit line contact (1F), and half of another isolation region (½F). FIG. 2B is a simplified cross-sectional view of the memory cell 200 (FIG. 2A) along A-A at a stage of processing. A more detailed description of the memory cell 200 will be provided with respect to FIGS. 3 through 10, which illustrate the memory cell 200 at various stages of processing.

Figure 3:
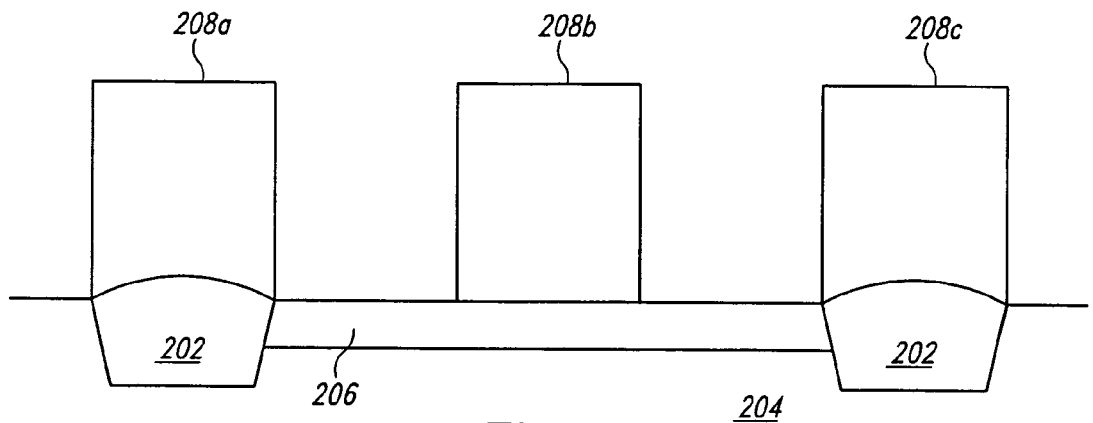
FIG. 3 is a simplified cross-sectional view of a semiconductor substrate that can be processed to form the memory cell of FIG. 2, in accordance with an embodiment of the present invention.

FIG. 3 is a simplified cross-sectional view of the memory cell 200 (FIG. 2) at a stage of processing. Formed in a p-type substrate 204 is an n-type active region 206 in which a pair of memory cells 200 are formed. The active region 206 is isolated from adjacent active regions by isolation regions 202. The active region 206 and the isolation regions 202 can be formed using conventional methods, for example, conventional masking, deposition, implant and drive-in processes. Following the formation of the isolation regions 202 and the active region 206, a layer of insulating material is deposited onto the substrate 204, masked and etched to form sacrificial structures 208a-c on the substrate 204. The insulating material from which the sacrificial structures 208a-c are formed is silicon nitride, or alternatively, as will be explained in more detail below, other insulating material to which subsequent etch processes are selective.

Figure 4:
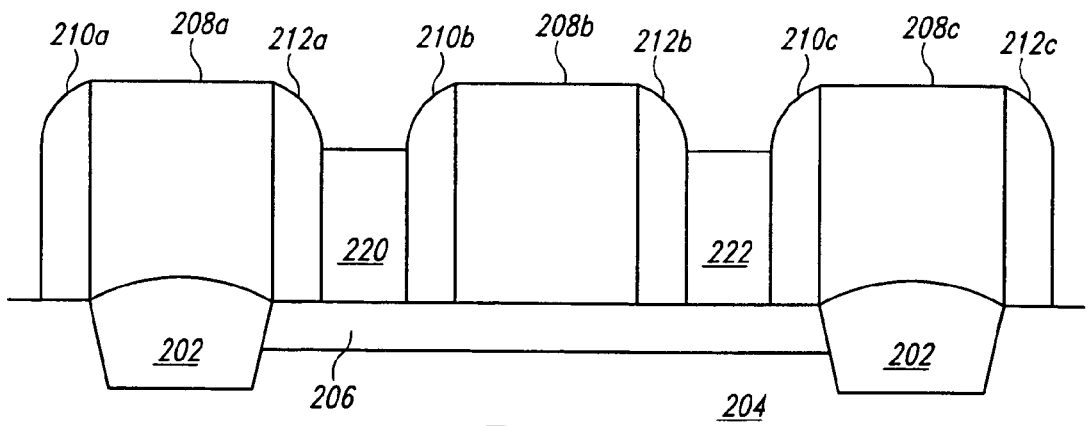
FIG. 4 is a simplified cross-sectional view of the substrate of FIG. 3 at a later point in processing, in accordance with an embodiment of the present invention.

FIG. 4 is a simplified cross-sectional view of the structure shown in FIG. 3 at a later point in processing, in accordance with an embodiment of the present invention. An insulating material is deposited over the substrate 204 and the sacrificial structures 208a-c and subsequently etched back using an anisotropic etch process. Suitable etch processes are known in the art. Sidewalls 210a-c, 212a-c are formed as a result of the deposition and etch back processes. The insulating layer can be formed from a silicon-oxide material, and the etch back process should be selective to the silicon nitride of the sacrificial structures 208a-c. A p-type epitaxial layer is formed on the exposed regions of the substrate 204, and etched to selectively form epitaxial "posts" 220, 222 within the trench region between the sacrificial nitride structures 208a, 208b, and 208b, 208c, respectively. As will be described in more detail below, the epitaxial posts 220, 222 represent the material in which vertical access transistors (i.e., word lines) will be formed and to which memory cell capacitors are electrically coupled.

Figure 5:
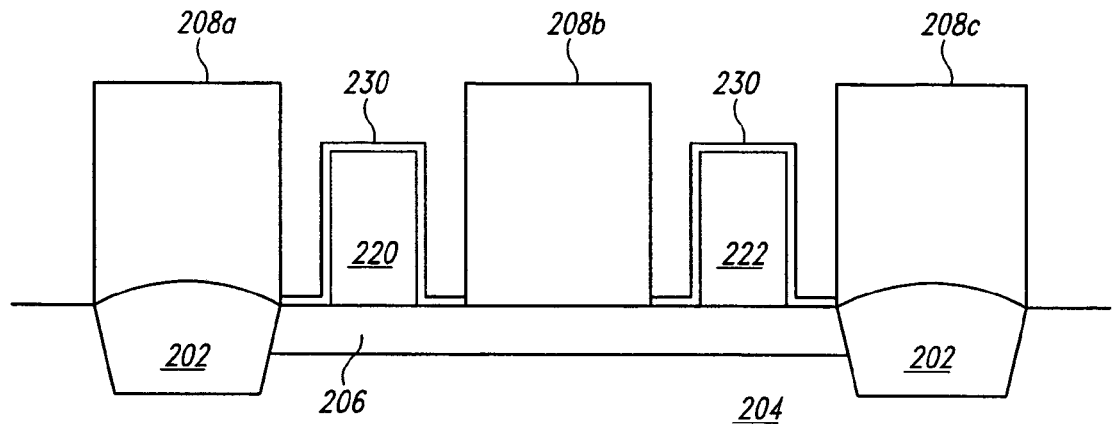
FIG. 5 is a simplified cross-sectional view of the substrate of FIG. 4 at a later point in processing, in accordance with an embodiment of the present invention.

FIG. 5 is a simplified cross-sectional view of the structure shown in FIG. 4 at a later point in processing, in accordance with an embodiment of the present invention. An etch process selective to the nitride sacrificial structures 208a-c and the epitaxial posts 220, 222 is performed to remove the oxide sidewalls 210a-c, 212a-c. Gate oxide 230 is then formed over the epitaxial posts 220, 222 and the exposed regions of the substrate 204. The material of the sacrificial structures 208a-c is such that oxide does not form thereon during the formation of the gate oxide 230.

Figure 6:
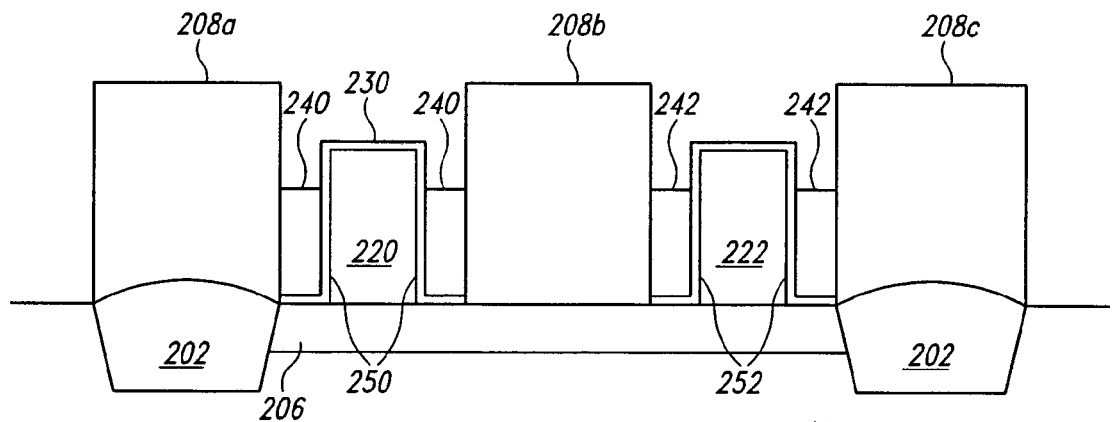
FIG. 6 is a simplified cross-sectional view of the substrate of FIG. 5 at a later point in processing, in accordance with an embodiment of the present invention.

FIG. 6 is a simplified cross-sectional view of the structure shown in FIG. 5 at a later point in processing, in accordance with an embodiment of the present invention. A polysilicon layer is formed over the structure of FIG. 5 followed by a masking and etch process to selectively remove portions of the polysilicon layer. An anisotropic etch back process is then performed to remove additional portions of polysilicon layer in order to form gates 240, 242 of vertical transistors 250, 252, respectively. The etch back process recesses the gates 240, 242 to below the height of the epitaxial posts 220, 222, respectively. Although shown in cross-section in FIG. 6, the gates 240, 242 surround the respective posts 220, 222. This is apparent from FIG. 2A, which illustrates that the gate 242 is part of a continuous polysilicon wordline that is formed around each of the epitaxial posts associated with the memory cells of that row.

Figure 7:
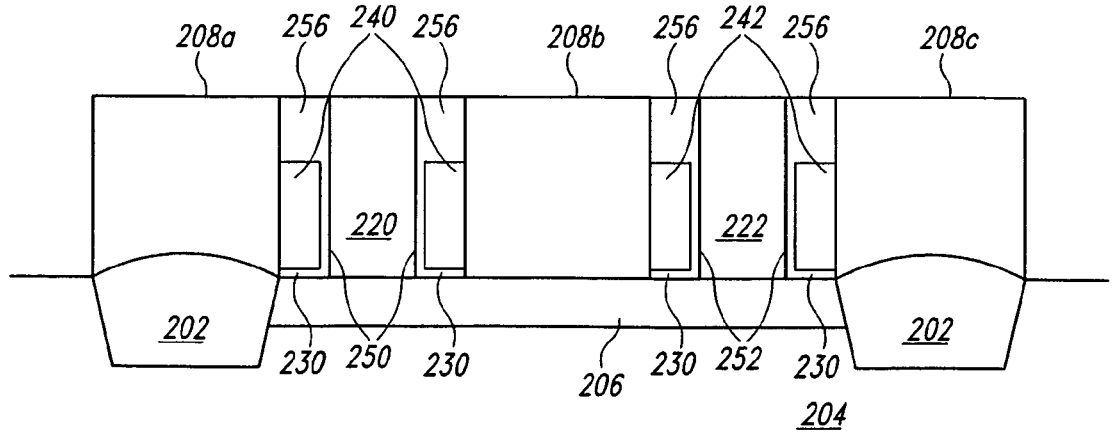
FIG. 7 is a simplified cross-sectional view of the substrate of FIG. 6 at a later point in processing, in accordance with an embodiment of the present invention.

FIG. 7 is a simplified cross-sectional view of the structure shown in FIG. 6 at a later point in processing, in accordance with an embodiment of the present invention. An insulating layer is formed over the structure shown in FIG. 6 and subsequently etched back to form a relatively planar surface. Although a conventional chemical-mechanical polishing process can be used for the etch back step, it will be appreciated that other suitable etch back processes may be used as well. The etch back process results in the formation of insulating spacers 256 to isolate the gates 240, 242 of the vertical transistors 250, 252. The insulating layer 258, and consequently, the insulating spacers 256, can be formed from a silicon oxide material, or other material, that is selective to a silicon nitride etch process.

Figure 8:
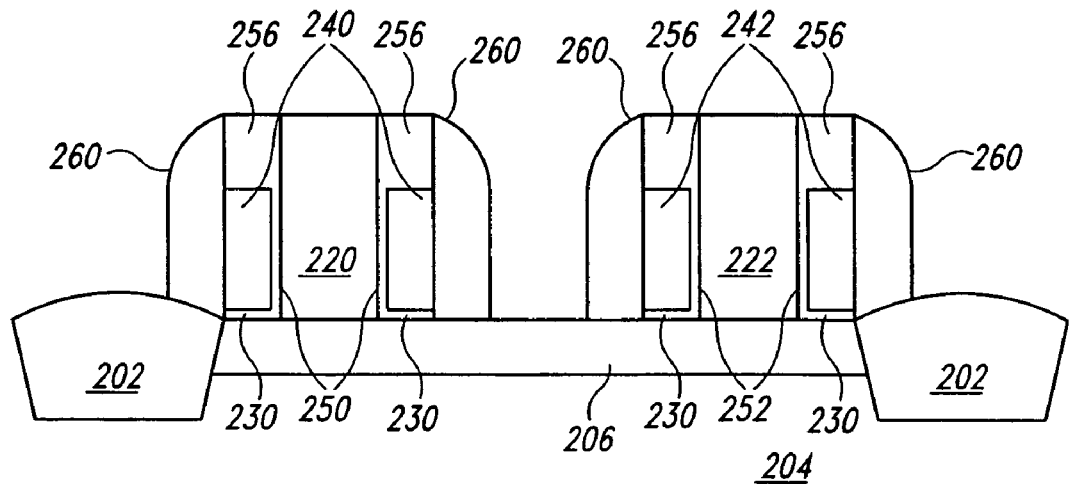
FIG. 8 is a simplified cross-sectional view of the substrate of FIG. 7 at a later point in processing, in accordance with an embodiment of the present invention.

FIG. 8 is a simplified cross-sectional view of the structure shown in FIG. 7 at a later point in processing, in accordance with an embodiment of the present invention. An etch process is used to remove the silicon nitride sacrificial structures 208a-c to leave the epitaxial posts 220, 222, the vertical transistors 250, 252, and the insulating spacers 256. An insulating material is then deposited over the remaining structure and anisotropically etched back to form sidewalls 260 that isolate the gates 240, 242 of the vertical transistors 250, 252, respectively. As shown in FIG. 2B, a dielectric interlayer 264 is subsequently deposited over the existing structure and etched back to form a planar surface on which digit lines and storage capacitors can be formed. Still with reference to FIG. 2B, a via 270 is formed through the dielectric interlayer 246 to expose a portion the active region 206. A conductive material 272 is subsequently deposited over the structure and in the via 270 to electrically contact the active region 206. The conductive material 272 is masked and etched to form a digit line contact.

Figure 9:
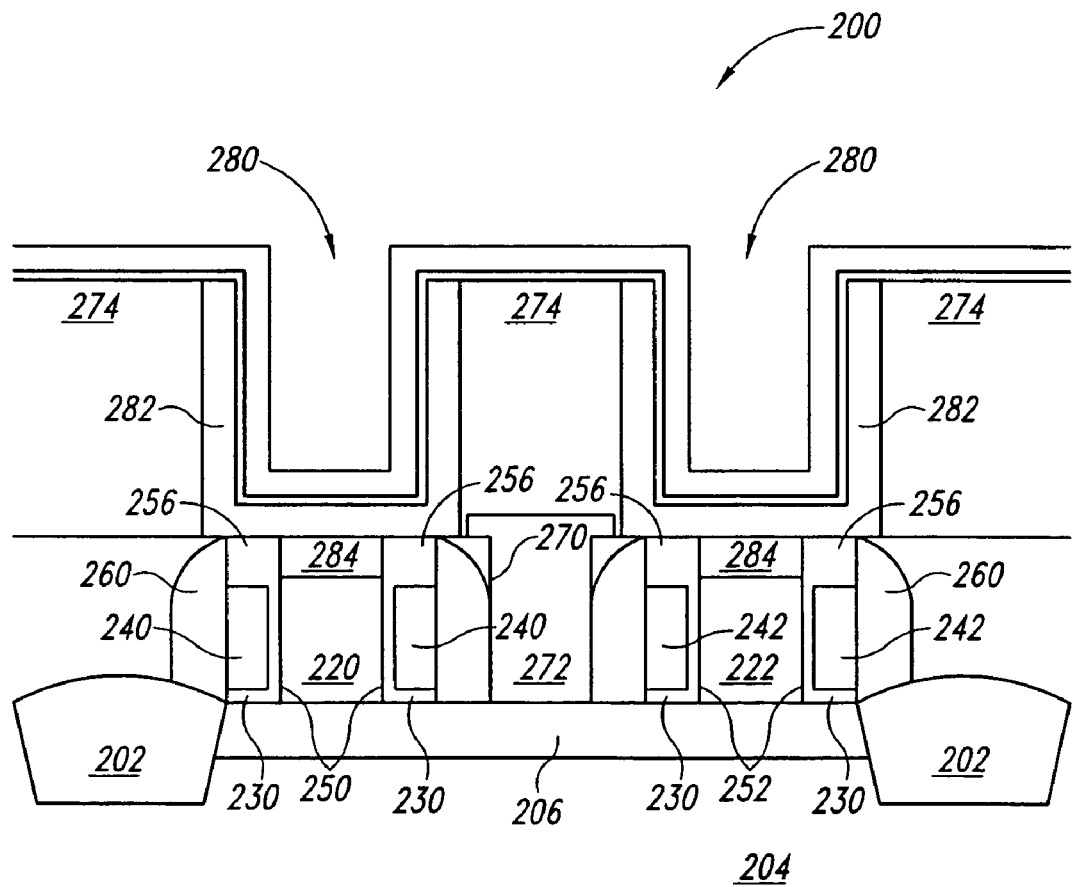
FIG. 9 is a simplified cross-sectional view of the structure of FIG. 2B at a later point in processing, in accordance with an embodiment of the present invention.

FIG. 9 is a simplified cross-sectional view of the structure shown in FIG. 2B at a later point in processing, in accordance with an embodiment of the present invention. A second dielectric interlayer 274 is deposited over the structure, and using conventional methods, container shaped memory cell capacitors 280 are formed in the second dielectric interlayer 274 and have a first capacitor plate 282 electrically coupled to a respective epitaxial post 220, 222. The first capacitor plate 282 can be formed from a highly doped polysilicon material, however, it will be appreciated that other suitable materials may be used as well. Following the formation of the first capacitor plates 282 of the memory cell capacitors 280, dopants from the highly doped polysilicon layer are diffused into the respective epitaxial post 220, 222 by heating the substrate 204. As a result, lightly doped conductive regions 284 are created in the epitaxial posts 220, 222 in a region adjacent the insulating spacers 256. The lightly doped conductive regions 284 provide a conductive path between a memory cell capacitor 280 and the respective gate 240, 242 of the vertical transistors 250, 252. Thus, when a vertical transistor is activated, the memory cell capacitor 280 can be electrically coupled to the active region 206.

Although embodiments of the present invention have been described as including container shaped memory cell capacitors 280, it will be appreciated that alternative capacitor structures can also be used as well without departing from the scope of the present invention. For example, conventional stacked capacitor structures electrically coupled to the epitaxial posts 220, 222 could be used in an alternative embodiment of the present invention. Alternatively, capacitors having a first capacitor plate with multiple polysilicon layers, that is, a "finned" capacitor, could also be used. Moreover, other modifications can be made to the memory cell capacitors 280 as well and still remain within the scope of the present invention. An example of such a modification includes forming memory cell capacitors 280 having a rough surface such as a hemispherical silicon grain (HSG) layer (not shown). Consequently, the present invention is not limited to the specific embodiments described herein.

Figure 10:
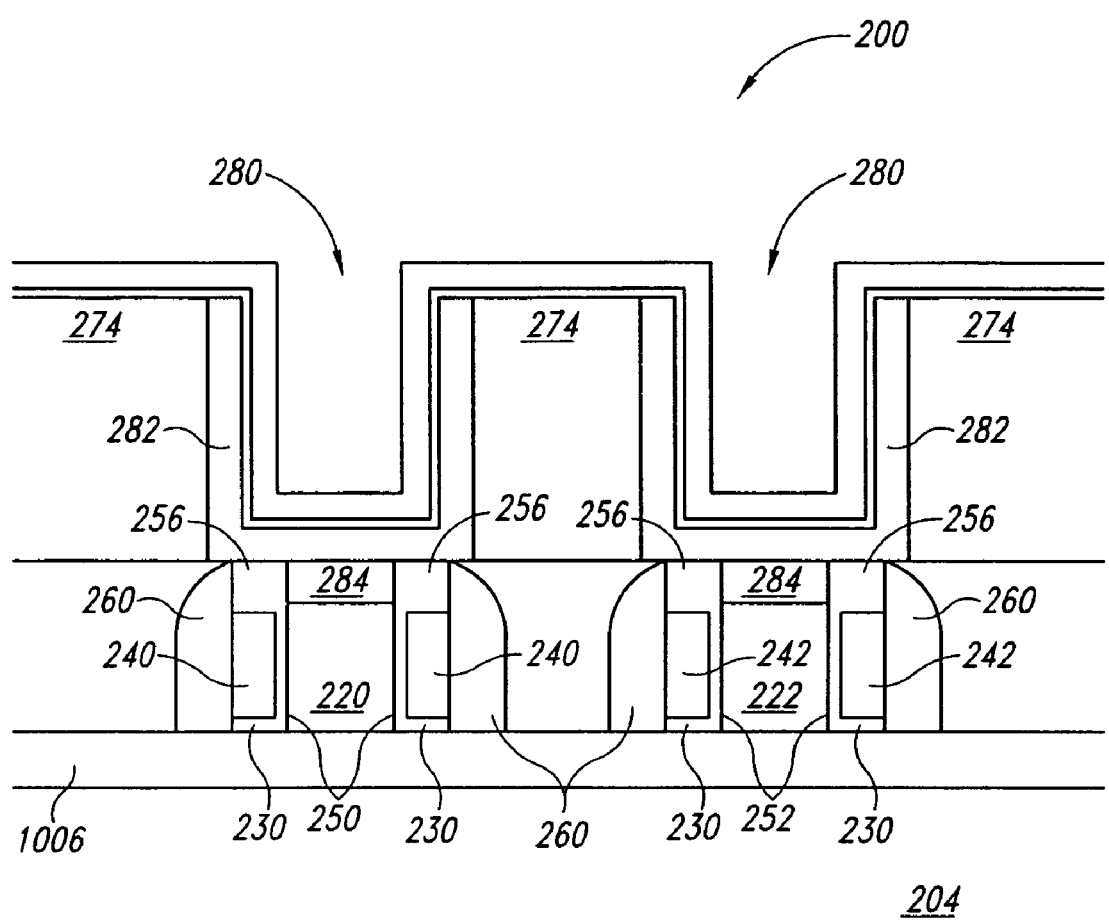
FIG. 10 is a simplified cross-sectional view of a pair of memory cell according to an alternative embodiment.

FIG. 10 illustrates a pair of memory cells 1000 according to an alternative embodiment of the present invention. Whereas memory cells 200 (FIG. 9) includes a digit line contact formed from a conductive material 272, the memory cell 1000 includes a buried digit line 1006. Formation of the buried digit line 1006 is well known in the art and can be formed using conventional processing methods.

It will be appreciated that the description provided herein is sufficient to enable those of ordinary skill in the art to practice the invention. Selecting specific process parameters, including temperature, doping levels, thicknesses, and the like, are well within the understanding of those ordinarily skilled in the art. Particular details such as these have been omitted from herein in order to avoid unnecessarily obscuring the present invention. It will be further appreciated that additional processing steps can be performed in fabricating the memory cells 200 without departing from the scope of the present invention. For example, in forming the isolation regions 202, an implant process can be performed to create a junction region below the isolation region 202 to minimize leakage currents between adjacent active regions. Another example of such a modification is performing an implant step prior to deposition of the conductive material 272 to create a highly doped region in the active region 206 to promote conductivity to the digit line contact.

Figure 11:
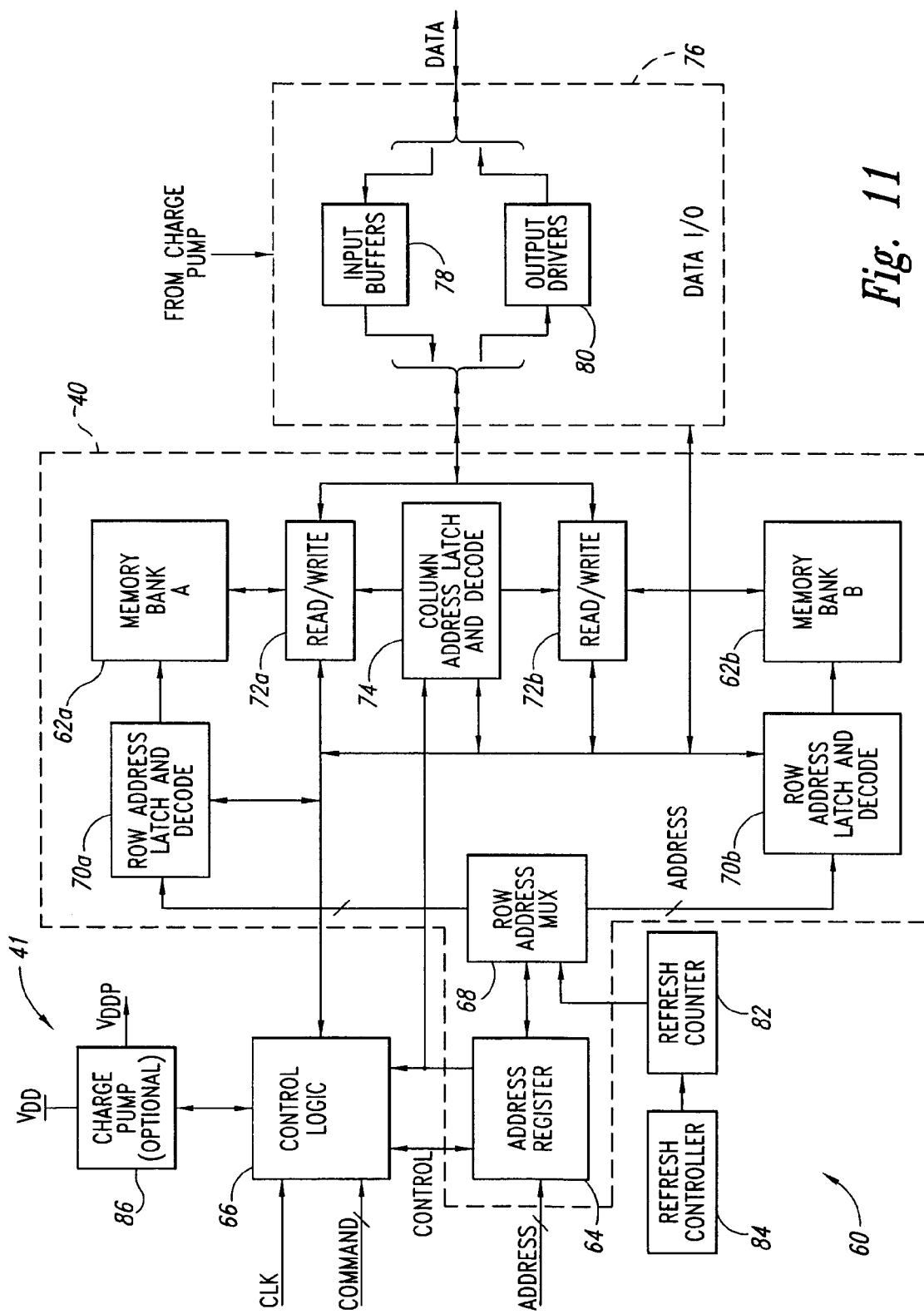
FIG. 11 is a functional block diagram of a memory circuit that includes memory cells according to an embodiment of the present invention.

FIG. 11 is a functional block diagram of one embodiment of a memory circuit 60, which includes memory banks 62a and 62b. These memory banks each incorporate a memory array according to an embodiment of the present invention. In one embodiment, the memory circuit 60 is a synchronous DRAM (SDRAM), although it may be another type of memory in other embodiments.

The memory circuit 60 includes an address register 64, which receives an address from an ADDRESS bus. A control logic circuit 66 receives a clock (CLK) signal receives clock enable (CKE), chip select (CS), row address strobe (RAS), column address strobe (CAS), and write enable (WE) signals from the COMMAND bus, and communicates with the other circuits of the memory device 60. A row-address multiplexer 68 receives the address signal from the address register 64 and provides the row address to the row-address latch-and-decode circuits 70a and 70b for the memory bank 62a or the memory bank 62b, respectively. During read and write cycles, the row-address latch-and-decode circuits 70a and 70b activate the word lines of the addressed rows of memory cells in the memory banks 62a and 62b, respectively. Read/write circuits 72a and 72b read data from the addressed memory cells in the memory banks 62a and 62b, respectively, during a read cycle, and write data to the addressed memory cells during a write cycle. A column-address latch-and-decode circuit 74 receives the address from the address register 64 and provides the column address of the selected memory cells to the read/write circuits 72a and 72b. For clarity, the address register 64, the row-address multiplexer 68, the row-address latch-and-decode circuits 70a and 70b, and the column-address latch-and-decode circuit 74 can be collectively referred to as an address decoder.

A data input/output (I/O) circuit 76 includes a plurality of input buffers 78. During a write cycle, the buffers 78 receive and store data from the DATA bus, and the read/write circuits 72a and 72b provide the stored data to the memory banks 62a and 62b, respectively. The data I/O circuit 76 also includes a plurality of output drivers 80. During a read cycle, the read/write circuits 72a and 72b provide data from the memory banks 62a and 62b, respectively, to the drivers 80, which in turn provide this data to the DATA bus.

A refresh counter 82 stores the address of the row of memory cells to be refreshed either during a conventional auto-refresh mode or self-refresh mode. After the row is refreshed, a refresh controller 84 updates the address in the refresh counter 82, typically by either incrementing or decrementing the contents of the refresh counter 82 by one. Although shown separately, the refresh controller 84 may be part of the control logic 66 in other embodiments of the memory device 60. The memory device 60 may also include an optional charge pump 86, which steps up the power-supply voltage VDD to a voltage VDDP. In one embodiment, the pump 86 generates VDDP approximately 1-1.5 V higher than VDD. The memory circuit 60 may also use VDDP to conventionally overdrive selected internal transistors.

Figure 12:
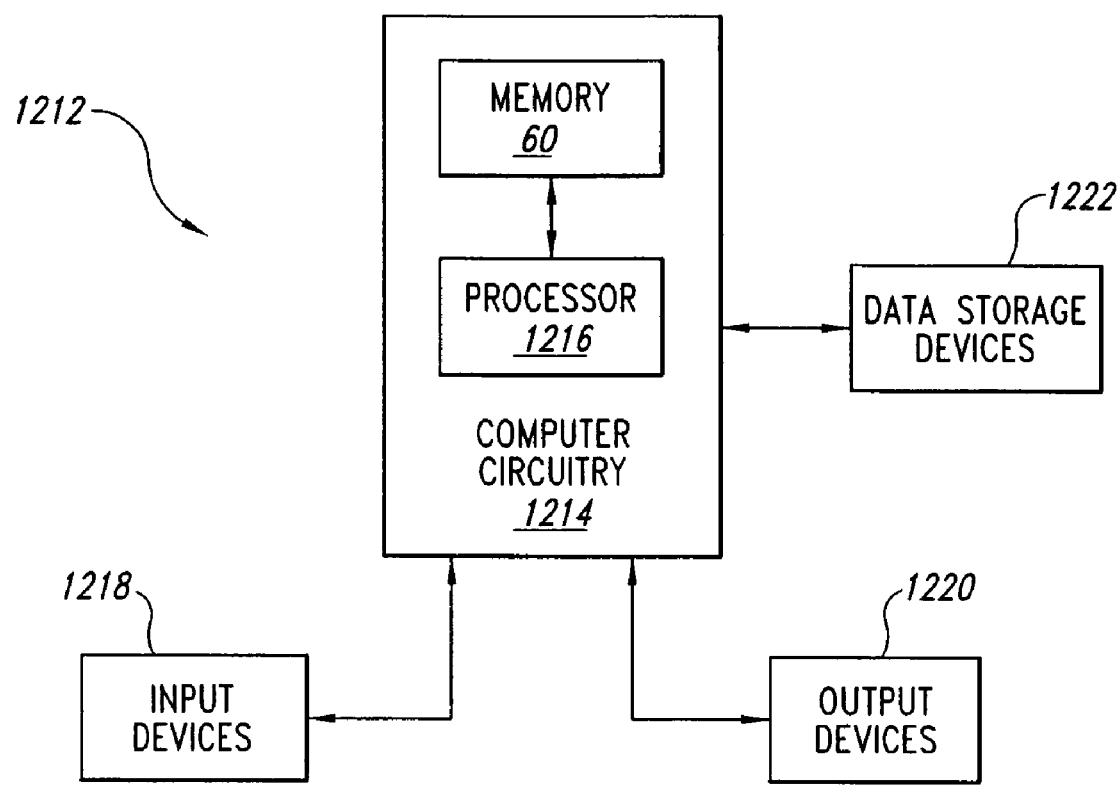
FIG. 12 is a functional block diagram of a computer system including a memory device according to the embodiment shown in FIG. 11.

FIG. 12 is a block diagram of an electronic system 1212, such as a computer system, that incorporates the memory circuit 60 of FIG. 11. The system 1212 also includes computer circuitry 1214 for performing computer functions, such as executing software to perform desired calculations and tasks. The circuitry 1214 typically includes a processor 1216 and the memory circuit 60, which is coupled to the processor 1216. One or more input devices 1218, such as a keyboard or a mouse, are coupled to the computer circuitry 1214 and allow an operator (not shown) to manually input data thereto. One or more output devices 1220 are coupled to the computer circuitry 1214 to provide to the operator data generated by the computer circuitry 1214. Examples of such output devices 1220 include a printer and a video display unit. One or more data-storage devices 1222 are coupled to the computer circuitry 1214 to store data on or retrieve data from external storage media (not shown). Examples of the storage devices 1222 and the corresponding storage media include drives that accept hard and floppy disks, tape cassettes, and compact disk read-only memories (CD-ROMs). Typically, the computer circuitry 1214 includes address data and command buses and a clock line that are respectively coupled to the ADDRESS, DATA, and COMMAND buses, and the CLK line of the memory device 60.

Figure 13A:
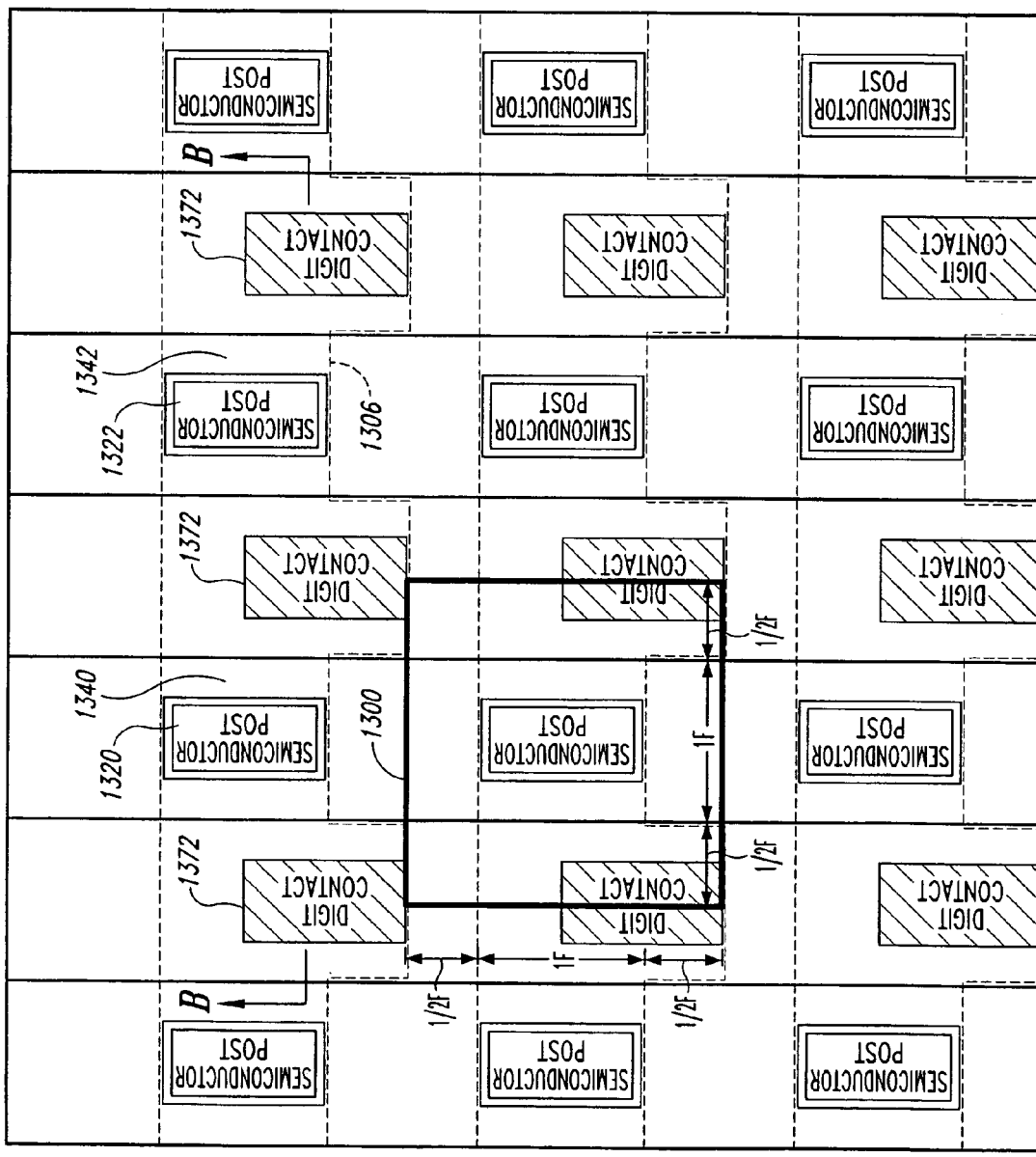
FIG. 13A is a simplified top plan view of memory cells according to an embodiment of the present invention.

FIG. 13A illustrates a memory cell 1300 having $4F^2$ dimensions. The array of memory cells 1300 include offset digit contacts 1372 between semiconductor posts of memory cells 1300 for a column of memory. Additionally, in comparison to the array of memory cells 200 of FIG. 2A, the array of memory cells 1300 does not include isolation regions between adjacent pairs of memory cells 1300. As a result, each memory cell 1300 shares a pair of offset digit contacts with adjacent memory cells. The digit contacts 1372 are offset in relation to the semiconductor posts, for example, 1320, 1322, and 1324, to allow for a digit line to pass over conductive plugs without the need to weave a digit line (not shown) between the semiconductor posts. As a result, access to the semiconductor posts for the formation of a memory cell capacitor is provided. The semiconductor posts and digit contacts 1372 coupled to a digit line are formed on an active region 1306. As shown in FIG. 13A, the memory cell 1300 has dimensions of 2F×2F, and thus, has an overall planar dimension of $4F^2$.

Figure 13B:
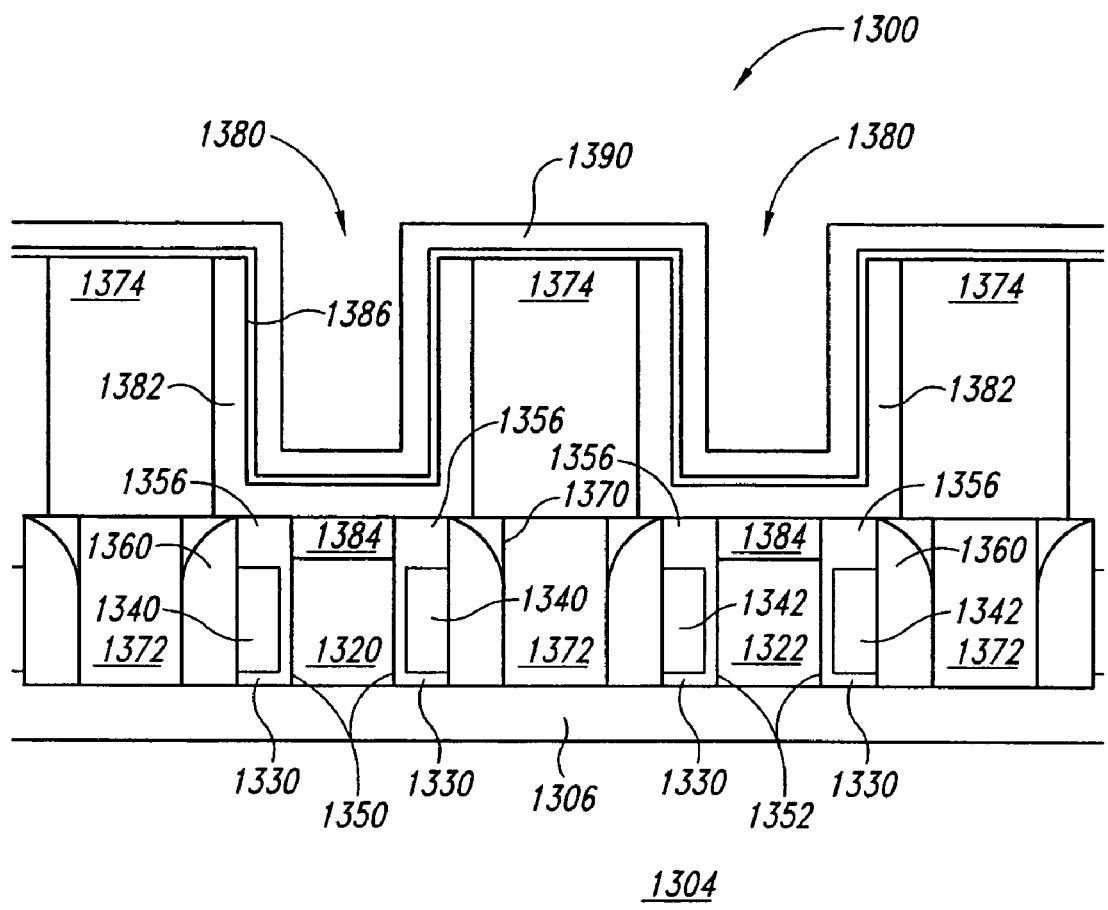
FIG. 13B is a simplified cross-sectional view of a pair of memory cells according to the embodiment shown in FIG. 13A.

FIG. 13B is a simplified cross-sectional view of two memory cells 1300 along B-B (FIG. 13A) at a stage of processing. The two memory cells 1300 in FIG. 13B are shown having container shaped memory cell capacitors 1380 formed on semiconductor posts 1320 and 1322 (FIG. 13A). However, alternative capacitor structures can be used as well. FIGS. 14-19, which illustrate the structure at different steps during the process of forming the two memory cells 1300 in FIG. 13B, will now be described.

Figure 14:
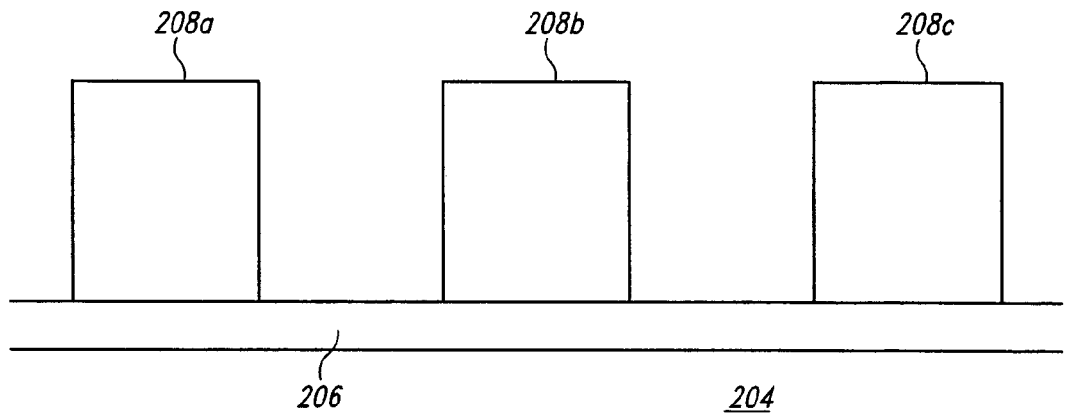
FIG. 14 is a simplified cross-sectional view of a semiconductor substrate that can be processed to form the memory cell of FIG. 13, in accordance with an embodiment of the present invention.

FIG. 14 is a simplified cross-sectional view of the two memory cells 1300 at a stage of processing. Formed in a p-type substrate 1304 is an n-type active region 1306. As previously mentioned, the active region 1306 is shared by the memory cells 1300 coupled to a digit line of a column of memory cells. The active region 1306 can be formed using conventional semiconductor fabrication methods, for example, conventional masking, deposition, ion implantation and drive-in processes, and the like. Following the formation of the active region 1306, a layer of insulating material is deposited onto the substrate 1304. The insulating material is masked and then etched to form sacrificial structures 1308a-c on the substrate 1304 and over the active region 1306. In the embodiment shown in FIG. 14, the insulating material from which the sacrificial structures 208a-c are formed is silicon nitride. Alternatively, other insulating material to which subsequent etch processes are selective can be used as well.

Figure 15:
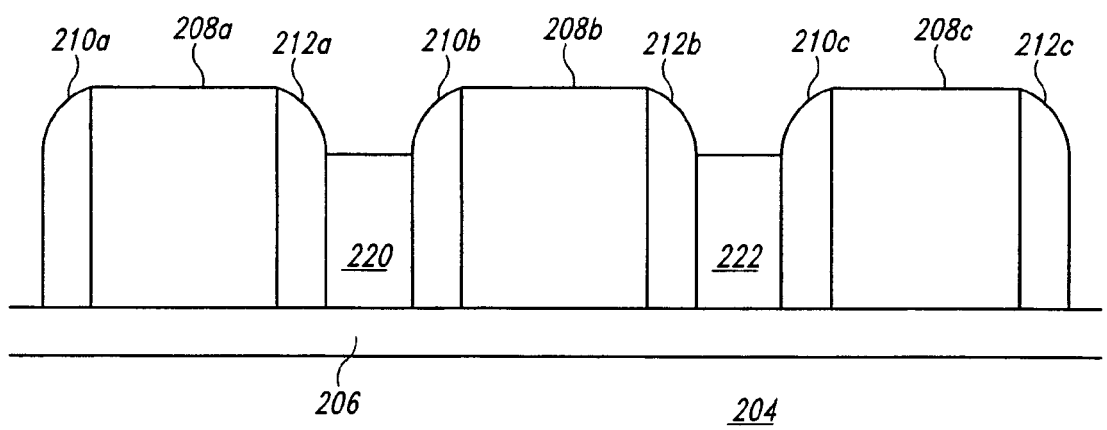
FIG. 15 is a simplified cross-sectional view of the substrate of FIG. 14 at a later point in processing, in accordance with an embodiment of the present invention.

FIG. 15 is a simplified cross-sectional view of the structure shown in FIG. 14 at a later point in processing. A layer of insulating material is formed over the substrate 1304 and the sacrificial structures 1308a-c. The insulating material is subsequently etched back using an etch process, for example, an anisotropic etch process to form sidewalls 1310a-c, 1312a-c. Suitable etch processes for the etch back of the layer of insulating material are known in the art. The insulating layer can be formed from a silicon-oxide material, and the etch back process should be selective to the material of the sacrificial structures 1308a-c. A p-type silicon layer is formed on the exposed regions of the substrate 204, and etched to selectively form semiconductor posts 1320, 1322 within the trench region between the sidewalls 1310a-c, 1312a-c of the sacrificial nitride structures 1308a, 1308b, and 1308b, 1308c, respectively. As will be described in more detail below, the semiconductor posts 1320, 1322 represent the material in which vertical access transistors are formed and to which memory cell capacitors are electrically coupled. In one embodiment, the semiconductor posts can be formed from a p-type epitaxial silicon material. However, different semiconductor materials can be used in alternative embodiments.

Figure 16:
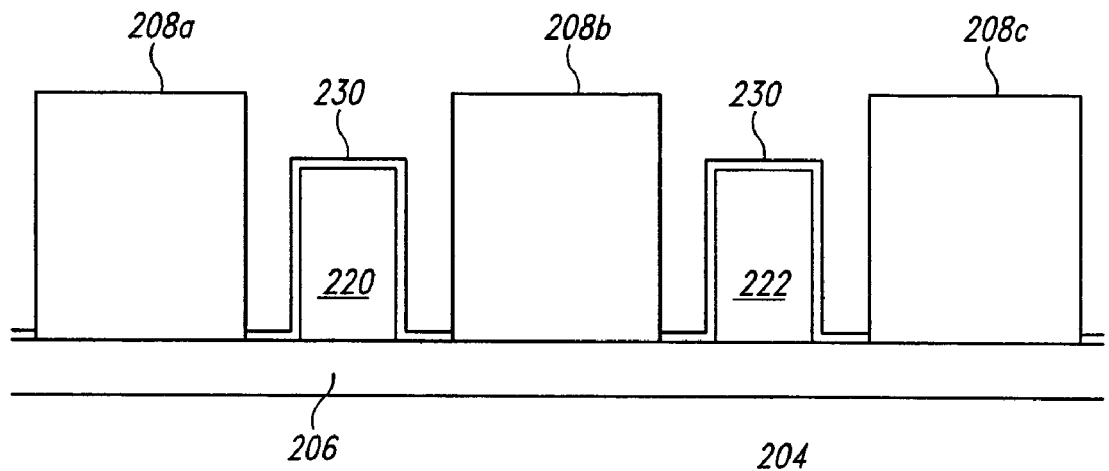
FIG. 16 is a simplified cross-sectional view of the substrate of FIG. 15 at a later point in processing, in accordance with an embodiment of the present invention.

FIG. 16 is a simplified cross-sectional view of the structure shown in FIG. 15 at a later point in processing. An etch process selective to the nitride sacrificial structures 1308a-c and the semiconductor posts 1320, 1322 is performed to remove the oxide sidewalls 1310a-c, 1312a-c. Gate oxide 1330 is then formed over the semiconductor posts 1320, 1322 and the exposed regions of the substrate 1304. In one embodiment, the material of the sacrificial structures 1308a-c is such that oxide does not form thereon during the formation of the gate oxide 230. However, different materials can be used as well for alternative embodiments.

Figure 17:
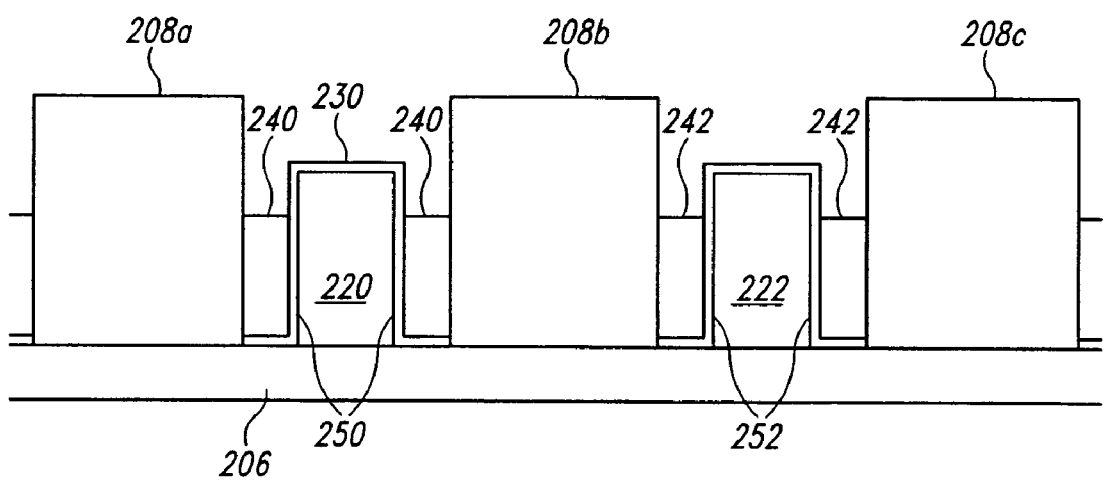
FIG. 17 is a simplified cross-sectional view of the substrate of FIG. 16 at a later point in processing, in accordance with an embodiment of the present invention.

FIG. 17 is a simplified cross-sectional view of the structure shown in FIG. 16 at a later point in processing. A polysilicon layer is formed over the structure of FIG. 16 followed by a masking and etch process to selectively remove portions of the polysilicon layer. An anisotropic etch back process is then performed to remove additional portions of the polysilicon layer in order to form gates 1340, 1342 of vertical transistors 1350, 1352, respectively. The etch back process recesses the gates 1340, 1342 to below the height of the semiconductor posts 1320, 1322, respectively. The resulting gates 1340, 1342 surround the respective semiconductor posts 1320, 1322. This can be seen in FIG. 13A, which illustrates that the gates 1340, 1342 as being part of a continuous respective polysilicon wordline that is formed around the semiconductor posts for the memory cells 1300 of a row of memory cells. In alternative embodiments, different materials are used in the formation of the gates 1340, 1342 of the vertical transistors 1350, 1352. For example, materials such as titanium nitride, titanium silicon, molybdenum silicon, nickel silicon, and the like can be used as well.

Figure 18:
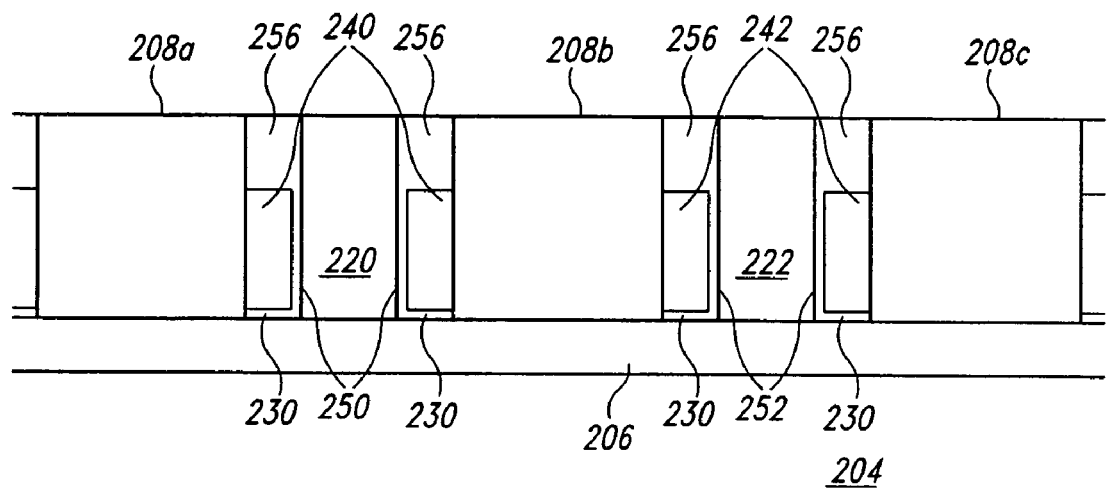
FIG. 18 is a simplified cross-sectional view of the substrate of FIG. 17 at a later point in processing, in accordance with an embodiment of the present invention.

FIG. 18 is a simplified cross-sectional view of the structure shown in FIG. 17 at a later point in processing. An insulating layer is formed over the structure shown in FIG. 17 and subsequently etched back to form a relatively planar surface. Although a conventional chemical-mechanical polishing process can be used for the etch back step, it will be appreciated that other suitable etch back processes may be used as well. The etch back process results in the formation of insulating spacers 1356 to isolate the gates 1340, 1342 of the vertical transistors 1350, 1352. The insulating layer 1358, and consequently, the insulating spacers 1356, can be formed from a silicon oxide material, or other material, that is selective to a silicon nitride etch process.

Figure 19:
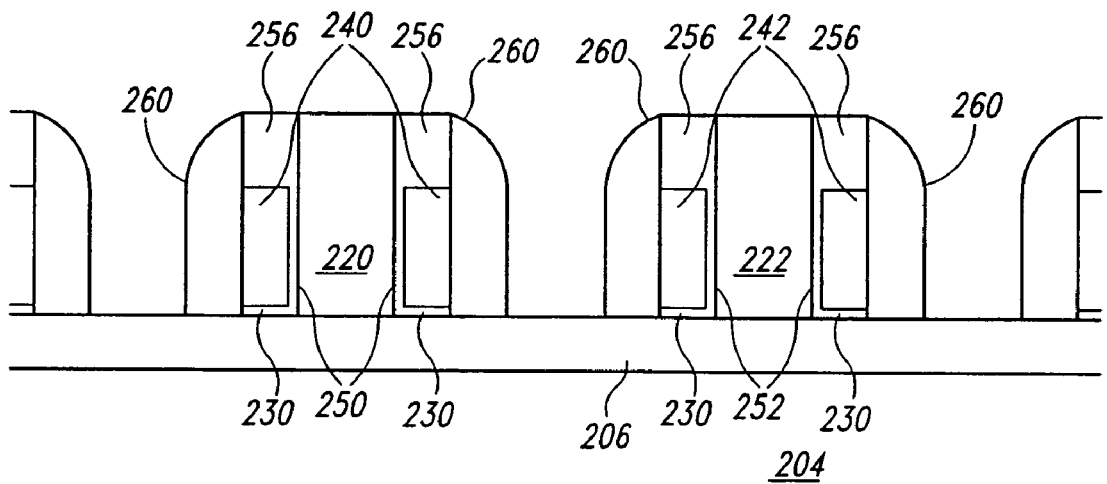
FIG. 19 is a simplified cross-sectional view of the substrate of FIG. 18 at a later point in processing, in accordance with an embodiment of the present invention.

FIG. 19 is a simplified cross-sectional view of the structure shown in FIG. 18 at a later point in processing. An etch process is used to remove the silicon nitride sacrificial structures 1308a-c, leaving the semiconductor posts 1320, 1322, the vertical transistors 1350, 1352, and the insulating spacers 1356. An insulating material is then deposited over the remaining structure and anisotropically etched back to form sidewalls 1360 which isolate the gates 1340, 1342 of the vertical transistors 1350, 1352, respectively.

With reference to FIG. 13B, a dielectric interlayer 1364 is subsequently deposited over the structure shown in FIG. 19 and etched back to form a planar surface on which digit lines (not shown) and storage capacitors 1380 can be formed. Still with reference to FIG. 13B, a via 1370 is formed through the dielectric interlayer 1346 to expose a portion the active region 1306. A conductive or semiconductive material 1372 is subsequently deposited over the structure and in the via 1370 to electrically contact the active region 1306. The conductive material 1372 is masked and etched to form a digit line contact. Alternatively, a conductive material can be formed in the via 1370, and a subsequently formed layer of conductive material is masked and etched to form a digit line in electrical contact with the active region 1306. Examples of the conductive materials that can be used are doped polysilicon, titanium, titanium nitride, titanium tungsten, tungsten, copper, tungsten nitride, and the like. However, it will be appreciated that alternative materials to the aforementioned ones can be used as well.

A second dielectric interlayer 1374 is deposited over the structure, and using conventional methods, container shaped memory cell capacitors 1380 are formed in the second dielectric interlayer 1374 and have a first capacitor plate 1382 electrically coupled to a respective semiconductor post 1320, 1322, a capacitor dielectric layer 1390, and a second capacitor plate 1390. The capacitor dielectric layer 1390 can be formed from a dielectric material such as silicon nitride. Alternatively, different materials such as aluminum oxide, hafnium oxide, and the like can be used as well. The first and second capacitor plates 1382, 1390 can be formed from a highly doped polysilicon material. However, it will be appreciated that other suitable materials may be used, such as,titanium, titanium nitride, tantalum, platinum, and the like.

Following the formation of the first capacitor plates 1382 of the memory cell capacitors 1380, dopants from the highly doped polysilicon layer are diffused into the respective semiconductor post 1320, 1322. In one embodiment, the substrate 1304 is heated to diffuse the dopants into the semiconductor posts. As a result, lightly doped conductive regions 1384 are created in the semiconductor posts 1320, 1322 in a region adjacent the insulating spacers 1356. The lightly doped conductive regions 1384 provide a conductive path between a memory cell capacitor 1380 and the respective gate 1340, 1342 of the vertical transistors 1350, 1352. The lightly doped conductive regions 1384 generally represent a first source/drain region of the vertical transistors and the active region 1360 generally represents a second source/drain region of the vertical transistors.

Thus, when a vertical transistor is activated, the memory cell capacitor 1380 can be electrically coupled to the active region 1306.

Various modifications to the embodiment illustrated with respect to FIGS. 13-19 can be made without departing from the scope of the present invention. For example, the digit contact is shown in FIG. 13A as a rectangular region that includes a portion that extends into the active region 1306 between the semiconductor posts of adjacent memory cells 1300. However, the digit contact can be modified to not extend into the region in between the semiconductor posts. Additionally, the specific materials previously described with respect to the memory cell 1300 and FIGS. 13-19 can be modified to use other materials known to those ordinarily skilled in the art, or suitable materials developed hereafter.

From the foregoing it will be appreciated that, although specific embodiments of the invention have been described herein for purposes of illustration, various modifications may be made without deviating from the spirit and scope of the invention. For example, the memory cells 200 and 1300 have been illustrated as having semiconductor posts with a rectangular or quadrilateral cross-sectional area. However, the semiconductor posts can be formed having a generally circular cross-sectional area or a generally polygonal cross-sectional area as well. Accordingly, the invention is not limited except as by the appended claims.

What is claimed is:

1. A method for forming a plurality of memory cell structures on a surface of a substrate, comprising:
   forming an active region in the substrate;
   forming a plurality of posts on the surface of the substrate over the active region, the plurality of posts formed from a semiconductor material and spaced apart from one another by respective regions;
   forming a plurality of contacts over and electrically coupled to the active region, each contact having at least a portion formed adjacent a respective one of the regions for a pair of posts;
   forming a plurality of memory cell capacitors on a respective one of the plurality of posts; and
   forming a plurality of gate structures adjacent a respective one of the plurality of posts to form a respective vertical transistor to electrically couple the respective memory cell capacitor to the active region.

2. The method of 1 wherein forming the plurality of contacts comprises forming each contact of the plurality of contacts over a respective portion of the active region that extends laterally on the surface of the substrate from a respective region between a pair of posts.

3. The method of claim 1 wherein forming the plurality of contacts comprises forming each contact of the plurality of contacts adjacent a respective one of the regions for the pair of posts and equidistant from each of the posts of the pair.

4. The method of claim 1 wherein forming the plurality of contacts comprises forming each contact of the plurality of contacts having a first portion formed adjacent a respective one of the regions for a pair of posts and further having a second portion formed in the region between the pair of posts.

5. The method of claim 1 wherein forming the active region in the substrate comprises forming an active region extending laterally across the surface of the substrate and the plurality of posts formed over the active region comprises at least three posts.

6. The method of claim 1 wherein forming the plurality of posts comprises forming each post of the plurality of posts from a doped epitaxial silicon material.

7. The method of claim 1 wherein forming the plurality of posts comprises forming each post of the plurality of posts having first and second opposite lateral surfaces and forming the plurality of gate structures comprises forming each gate structure of the plurality of gate structures adjacent to the first and second opposite lateral surfaces of the respective post.

8. The method of claim 1 wherein forming the plurality of posts comprises forming each post of the plurality of posts having first and second adjacent lateral surfaces and forming the plurality of gate structures comprises forming each gate structure of the plurality of gate structures adjacent to the first and second adjacent lateral surfaces of the respective post.

9. The method of claim 1 wherein forming the plurality of memory cell capacitors comprises forming each memory cell capacitor of the plurality of memory cell capacitors having a container-shaped capacitor structure.

10. A method for forming a plurality of memory cell structures on a surface of a substrate, comprising:
    forming an active region in the substrate;
    forming a semiconductor post on the active region;
    forming first and second contacts on the active region and laterally disposed on opposite sides of the semiconductor post along the surface of the substrate;
    forming a memory cell capacitor on the semiconductor post; and
    forming a vertical access transistor having a gate adjacent the semiconductor post and to electrically couple the capacitor to the first and second contacts in response to being activated.

11. The method of claim 10 wherein forming the first and second contacts comprises forming the first and second contacts equidistant from the semiconductor post.

12. The method of claim 10 wherein forming the first and second contacts comprises forming the first and second contacts from a titanium material.

13. The method of claim 10 wherein forming the first and second contacts comprises forming the first and second contacts from a tungsten material.

14. The method of claim 10 wherein forming the first and second contacts comprises forming the first and second contacts from a metal material.

15. The method of claim 10 wherein forming the memory cell capacitor comprises:
    forming a first capacitor plate layer from a first material;
    forming a second capacitor plate layer from a second material; and
    forming a dielectric layer disposed between the first and second capacitor plate layers.

16. The method of claim 15 wherein forming the dielectric layer comprises forming the dielectric layer from a layer of aluminum oxide.

17. The method of claim 15 wherein forming the dielectric layer comprises forming the dielectric layer from a layer of hafnium oxide.

18. The method of claim 15 wherein forming the first and second plates comprises forming the first and second plates from the same material.

19. The method of claim 15 wherein forming the first and second plates comprises forming the first and second plates from a titanium material.

20. The method of claim 15 wherein forming the first and second plates comprises forming the first and second plates from a tantalum material.

21. The method of claim 15 wherein forming the first and second plates comprises forming the first and second plates from a platinum material.

22. The method of claim 10 wherein forming the vertical access transistor comprises forming a gate structure from a titanium material.

23. The method of claim 10 wherein forming the vertical access transistor comprises forming a gate structure from a molybdenum material.

24. The method of claim 10 wherein forming the vertical access transistor comprises forming a gate structure from a nickel material.

25. The method of claim 10 wherein forming the vertical access transistor comprises forming a gate structure from a silicon material.

* * * * *